(12) United States Patent
Durairajan et al.

(10) Patent No.: US 9,018,980 B1
(45) Date of Patent: Apr. 28, 2015

(54) BIMODAL CLOCK GENERATOR

(71) Applicant: Xilinx, Inc., San Jose, CA (US)

(72) Inventors: Uma Durairajan, Sunnyvale, CA (US);
Subodh Kumar, San Jose, CA (US);
Michelle Zeng, San Jose, CA (US);
Hsiao H. Chen, Campbell, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 14/303,041

(22) Filed: Jun. 12, 2014

(51) Int. Cl.
| | |
|---|---|
| *H03K 19/00* | (2006.01) |
| *H03K 3/012* | (2006.01) |
| *H03K 19/0175* | (2006.01) |
| *G06F 1/32* | (2006.01) |
| *G11C 7/22* | (2006.01) |

(52) U.S. Cl.
CPC ............ *H03K 19/0016* (2013.01); *H03K 3/012* (2013.01); *H03K 19/017581* (2013.01); *G06F 1/324* (2013.01); *G11C 7/222* (2013.01)

(58) Field of Classification Search
CPC .................... H03K 19/006; H03K 19/017581; G11C 7/1072; G11C 7/222; G06F 1/324
USPC ....................................................... 326/93, 38
See application file for complete search history.

(56) References Cited

U.S. PATENT DOCUMENTS

| | | | | |
|---|---|---|---|---|
| 5,365,182 | A * | 11/1994 | King .............................. | 327/115 |
| 5,666,324 | A * | 9/1997 | Kosugi et al. ............ | 365/233.11 |
| 5,926,053 | A * | 7/1999 | McDermott et al. .......... | 327/298 |
| 6,756,856 | B2 * | 6/2004 | Song et al. ..................... | 331/176 |
| 2004/0179419 | A1 * | 9/2004 | Choi ............................. | 365/233 |

* cited by examiner

*Primary Examiner* — Don Le
(74) *Attorney, Agent, or Firm* — W. Eric Webostad

(57) ABSTRACT

An apparatus relates generally to a clock generator is disclosed. The clock generator is coupled to receive an input clock signal and further coupled to provide an output clock signal. An address and control register is coupled to receive an address signal and the output clock signal. An access generator is coupled to receive the output clock signal. The clock generator includes: an input node coupled to receive the input clock signal; at least one pulse generator coupled to the input node to receive the input clock signal and further coupled to provide a clock control signal; and a control gate coupled to the input node to receive the input signal and further coupled to the at least one pulse generator to receive the clock control signal. The clock control signal is provided in a non-toggling state for a high-frequency mode and in a toggling state for a low-frequency mode.

20 Claims, 9 Drawing Sheets

BIMODAL CLOCK GENERATOR

TECHNICAL FIELD

The following description relates to integrated circuit devices ("ICs"). More particularly, the following description relates to a bimodal clock generator for an IC.

BACKGROUND

With respect to some IC circuits, they may be operated in a clock signal edge triggered mode at a high frequency. However, these IC circuits may consume too much power when operated at a low frequency. With respect to other IC circuits, they may be operated in a self-timed mode at a low frequency. However, these self-timed IC circuits may give up too much performance in order to provide sufficient margin to account for process-voltage-temperature ("PVT") variations. Hence, it is desirable to provide an IC circuit that overcomes one or more of these limitations.

SUMMARY

An apparatus relates generally to a clock generator. In such an apparatus, the clock generator is coupled to receive an input clock signal and further coupled to provide an output clock signal. An address and control register is coupled to receive an address signal and the output clock signal. An access generator is coupled to receive the output clock signal. The clock generator includes: an input node coupled to receive the input clock signal; at least one pulse generator coupled to the input node to receive the input clock signal and further coupled to provide a clock control signal; and a control gate coupled to the input node to receive the input signal and further coupled to the at least one pulse generator to receive the clock control signal. The at least one pulse generator is coupled to provide the clock control signal to the control gate in a non-toggling state for a high-frequency mode. The at least one pulse generator is coupled to provide the clock control signal to the control gate in a toggling state for a low-frequency mode.

A memory system generally relates to a clocked access. In such a memory system, a clock generator is coupled to receive an input clock signal and further coupled to provide an output clock signal. An address and control register is coupled to receive an address signal and the output clock signal. An access generator is coupled to receive the output clock signal. The clock generator includes: an input node coupled to receive the input clock signal; at least one pulse generator coupled to the input node to receive the input clock signal and further coupled to provide a clock control signal; and a control gate coupled to the input node to receive the input signal and further coupled to the at least one pulse generator to receive the clock control signal. The at least one pulse generator is coupled to provide the clock control signal to the control gate in a non-toggling state for a high-frequency mode. The at least one pulse generator is coupled to provide the clock control signal to the control gate in a toggling state for a low-frequency mode. A read/write control block is coupled to the access generator to receive an access initiated signal therefrom and further coupled to provide an access done signal. A reset block is coupled to the access generator to receive the access initiated signal and further coupled to the read/write control block to receive the access done signal to provide a reset signal. The clock generator is coupled to receive the reset signal as feedback to track operation.

A method generally relates to generation of an output clock signal. In such a method, an input clock signal is received. The input clock signal is directly input to a control gate. The input clock signal is provided to a chain of pulse generators to obtain a clock control signal therefrom. The clock control signal is input to the control gate. An output clock signal is obtained from the control gate. In a high-frequency mode, the clock control signal input to the control gate is in a non-toggling state. In a low-frequency mode, the clock control signal input to the control gate is in a toggling state.

Other features will be recognized from consideration of the Detailed Description and Claims, which follow.

BRIEF DESCRIPTION OF THE DRAWINGS

Accompanying drawings show exemplary apparatus(es) and/or method(s). However, the accompanying drawings should not be taken to limit the scope of the claims, but are for explanation and understanding only.

DETAILED DESCRIPTION

Figure 1:
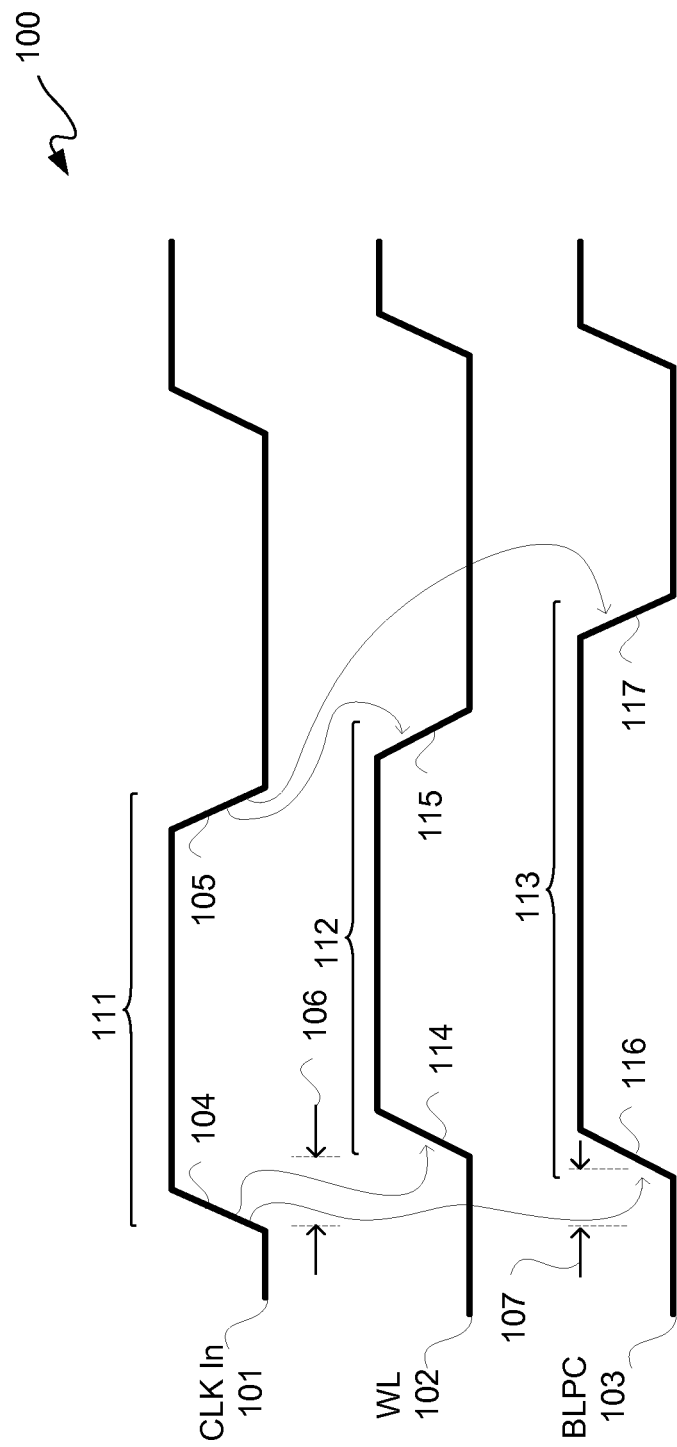
FIG. 1 is a signal diagram depicting an exemplary conventional signal timing.

In the following description, numerous specific details are set forth to provide a more thorough description of the specific examples described herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Before describing the examples illustratively depicted in the several figures, a general introduction is provided to further understanding.

Memory circuits may have an analog portion, which may involve a DC current path. Some of these memory circuits operate wordline access time directly proportional to frequency of a clock signal as triggered off of a falling edge of such a clock signal. Thus, for low frequency operation, wordlines may be held active for longer periods of time than necessary leading to excessive power consumption, as described below in additional detail. Other of these memory circuits may be self-timed, which can reduce power consumption at low frequency operation due to having shorter wordline access times than corresponding pulse widths of a clock signal. Unfortunately, in order to make sure PVT margins are comfortably met, these predetermined wordline durations may be longer than necessary, causing a loss in performance, namely operation at a slower rate than necessary. Both of these types of limitations are described below in additional detail with reference to FIGS. 1 and 2, respectively.

As described below in additional detail, a clock generation circuit is coupled to what may otherwise be a conventional memory circuit to provide for bimodal operation of such memory circuit. More particularly, a clock input signal is provided to a clock generator to provide a clock output signal, and this clock output signal may be in one of two modes of operation for bimodal clock generation. In a high-frequency mode of operation, such clock output signal operates as a pass through of such clock input signal. However, in a low-frequency mode, a wordline access is clamped to a duration that is shorter than a corresponding clock signal pulse to avoid excessive power consumption as compared with a conventional clock edge-only triggered memory circuit. Furthermore, because such a memory circuit is not limited to a self-timed operation, a high-frequency mode may be used to take advantage of higher performance options without the above-described limitation of a conventional self-timed memory circuitry.

With the above general understanding borne in mind, various configurations for clock generation are generally described below. Even though the following description is in terms of memory circuitry, other circuits with an analog component may employ clock generation as described below.

FIG. 1 is a signal diagram depicting an exemplary conventional signal timing 100. Signal timing 100 is for conventional clock signal falling-edge dependent waveforms for a memory device, whether a standalone memory device or an embedded memory device. For this example, signal timing 100 is for Static Random Access Memory ("SRAM") embedded in a Field Programmable Gate Array ("FPGA"); however, any memory device may have a signal timing 100 along the lines described herein.

Signal timing 100 includes an input clock signal ("CLK In") 101, a wordline signal ("WL") 102, and a bitline precharge signal ("BLPC") 103. Input clock signal 101 has a clock pattern with pulses 111, where each of pulses 111 have a rising edge 104 and a falling edge 105. For purposes of clarity and not limitation, a WL signal is generally described as a single control signal; however, a WL replica or WL reference signal may be used too to effectively provide such WL control signal. Conventionally, a WL signal bus includes multiple WL signals. Generally, wordline signal 102 may have pulses 112 corresponding to pulses 111 of input clock signal 101, where pulses 112 of wordline signal 102 may be delayed by a delay interval 106 with respect to pulses 111 of input clock signal 101. Along those lines, a rising edge 104 of input clock signal 101 may trigger a corresponding rising edge 114 of wordline signal 102, and a falling edge 105 of input clock signal 101 may trigger a corresponding falling edge 115 of wordline signal 102.

Likewise, generally, bitline precharge signal 103 may have pulses 113 corresponding to pulses 111 of input clock signal 101, where pulses 113 of bitline precharge signal 103 may be delayed by a delay interval 107 with respect to pulses 111 of input clock signal 101. Along those lines, a rising edge 104 of input clock signal 101 may trigger a corresponding rising edge 116 of bitline precharge signal 103, and a falling edge 105 of input clock signal 101 may trigger a corresponding falling edge 117 of bitline precharge signal 103. A rising edge 116 of bitline precharge signal 103 may slightly lead a rising edge 114 of wordline signal 102, and thus delay 107 may be slightly shorter than delay 106.

Precharging of bitlines for this example is triggered on falling edges 105 of input clock signal 101, in contrast to accessing wordlines which is triggered on rising edges 104 of input clock signal 101. For memory read or write accessing of memory cells coupled to a wordline, such accessing starts with rising edges 114 responsive to rising edges 104 of a clock cycle of input clock signal 101. For such a current clock cycle, a falling edge 115 corresponding to a falling edge 105 turns off wordline accessing, and a falling edge 117 corresponding to a falling edge 105 of such current clock cycle initiates precharging of bitlines to prepare memory cells for a next read or write operation in a next or subsequent clock cycle.

Accordingly, generally wordline read/write accessing consumes power during logic high time of wordline signal 102, such as for example during pulse 112 of wordline signal 102. Along those lines, for a low frequency mode of operation of a memory device, pulse width of pulses 111 of input clock signal 101 become longer. As pulses 111 become longer in pulse width, pulse width of pulses 112 of wordline signal 102, as well as pulse width of pulses 113 of bitline precharge signal 103, likewise become longer. Thus, wordlines and bitlines may have a variable on period. With respect to wordlines in particular, during an on period, such as during a logic high time of wordline signal 102, DC current may flow to one or more memory cells in a memory array of an SRAM from bitline clamp devices or bitline leaker devices, namely these bitline devices are active when a wordline is active. As clock frequency is reduced, such DC current may continue to flow for a half of a cycle of input clock signal 101. This is a high amount of current, and according consumes a significant amount of power when operating at a low frequency mode.

In short, signals 102 and 103 track a pulse width of input clock signal 101. Pulse widths of pulses 111 get longer, and thus likewise pulse widths of pulses 112 and 113 get longer, for such low frequency mode of operation, and so significantly more power is consumed. Therefore, a conventional clock falling edge triggered timing, or more generally a frequency-dependent timing, is generally only suitable for operating in a high frequency mode of operation for power limited applications.

Figure 2:
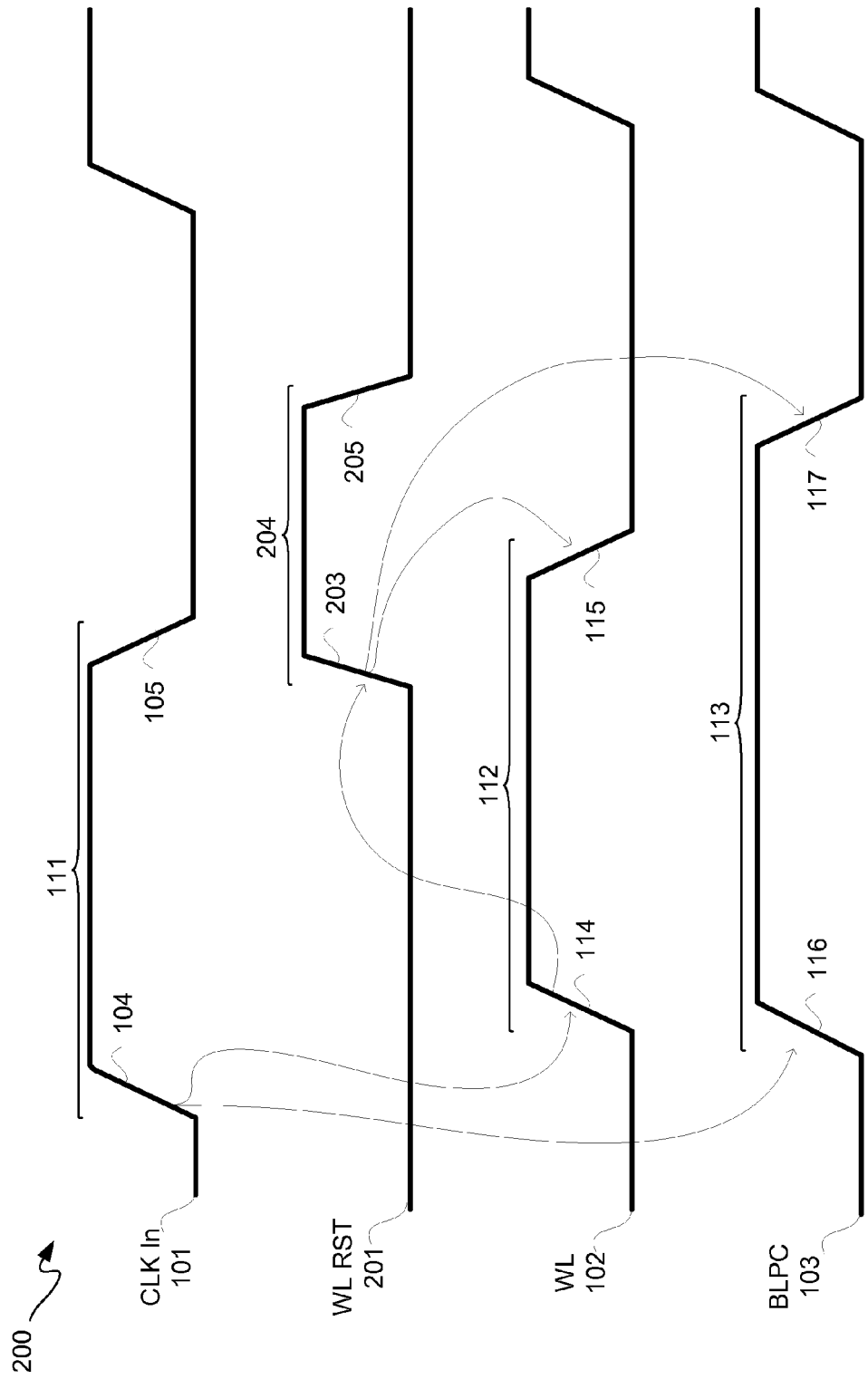
FIG. 2 is a signal diagram depicting another exemplary conventional signal timing.

FIG. 2 is a signal diagram depicting an exemplary conventional signal timing 200. Signal timing 200 is for conventional self-timed dependent waveforms for a memory device, whether a standalone memory device or an embedded memory device. For this example, signal timing 200 is for SRAM embedded in an FPGA; however, any memory device may have a signal timing 200 along the lines described herein.

Signal timing 200 includes an input clock signal 101, a wordline signal 102, a bitline precharge signal 103, and a wordline reset signal ("WL RST") 201. Input clock signal 101 has a clock pattern with pulses 111, where each of pulses 111 have a rising edge 104 and a falling edge 105. Generally, wordline signal 102 may have pulses 112 corresponding to pulses 111 of input clock signal 101, where pulses 112 of wordline signal 102 may be delayed by a delay interval 106, such as previously described with reference to FIG. 1. Along those lines, a rising edge 104 of input clock signal 101 may trigger a corresponding rising edge 114 of wordline signal 102; however, a falling edge 105 of input clock signal 101 does not trigger a corresponding falling edge 115 of wordline signal 102. Rather, a rising edge 203 of wordline reset signal 201 may trigger a corresponding falling edge 115 of wordline signal 102. A tracking delay circuit that tracks a rising edge 114 may be used to generate a wordline reset signal 201.

Along those lines, a rising edge 114 of wordline signal 102 may subsequently trigger a rising edge 203 of wordline reset signal 201.

Likewise, generally, bitline precharge signal 103 may have pulses 113 corresponding to pulses 111 of input clock signal 101, where pulses 113 of bitline precharge signal 103 may be delayed by a delay interval 107, such as previously described with reference to FIG. 1. Along those lines, a rising edge 104 of input clock signal 101 may trigger a corresponding rising edge 116 of bitline precharge signal 103; however, a falling edge 105 of input clock signal 101 does not trigger a corresponding falling edge 117 of bitline precharge signal 103. Rather, a rising edge 203 of wordline reset signal 201 may trigger a corresponding falling edge 117 of bitline precharge signal 103.

Precharging of bitlines, and stopping accessing of wordlines for read or write operations, for this example is triggered on rising edges of wordline reset signal 201. Accessing wordlines is still triggered on rising edges 104 of input clock signal 101. For memory read or write accessing of memory cells coupled to a wordline, such accessing starts with rising edges 114 responsive to rising edges 104 of a clock cycle of input clock signal 101. For a current clock cycle, a falling edge 115 corresponding to a rising edge 203 turns off wordline accessing, and a falling edge 117 corresponding to such a falling edges 203 of such current clock cycle initiates precharging of bitlines to prepare memory cells for a next read or write operation in a next or subsequent clock cycle. Pulse width of pulse 204 of wordline reset signal 201 adds an additional amount of time for such self-timed reset, and accordingly a wordline is not release for a next access until after a falling edge 205 of pulse 204.

Pulse width of wordline pulses 112 of wordline signal 102 in a self-timed configuration is generally a fixed pulse width which is less of a function of clock frequency of input clock signal 101 as compared with a falling clock edged configuration. Along those lines, a DC current path from bitline clamp and/or leaker devices to memory cells in an SRAM array may only be active for a fixed period of time. As clock frequency of input clock signal 101 is reduced, power consumption may likewise be reduced. In other words, as frequency of operation is reduced, percentage of DC current per clock cycle may be proportionally reduced.

Because pulse width of wordline pulses 112 of wordline signal 102 are generally fixed in width, such pulse width is set to be sufficient across process-voltage-temperature ("PVT") variations to ensure that read and write operations are completed within such fixed amount of time. In short, this means that pulse width of wordline pulses 112 of wordline signal 102 cannot be too small.

However, a longer duration during which wordline signal 102 is active logic high, or low as applicable, means that clock frequency is lessened or reduced. Hence, pulse width of wordline pulses 112 of wordline signal 102 cannot be too long or too much performance ("speed of operation" or "speed") may be lost.

Conventionally, pulse width of wordline pulses 112 of wordline signal 102 may be dictated by the pulse width for a worst case PVT corner. This convention may result in an excessive amount of margin at speed corners. In short, this effectively causes a circuit to be run at a slower frequency at speed corners in order to satisfy the margins at a worst case PVT corner to guarantee functionality and yield.

Figure 3:
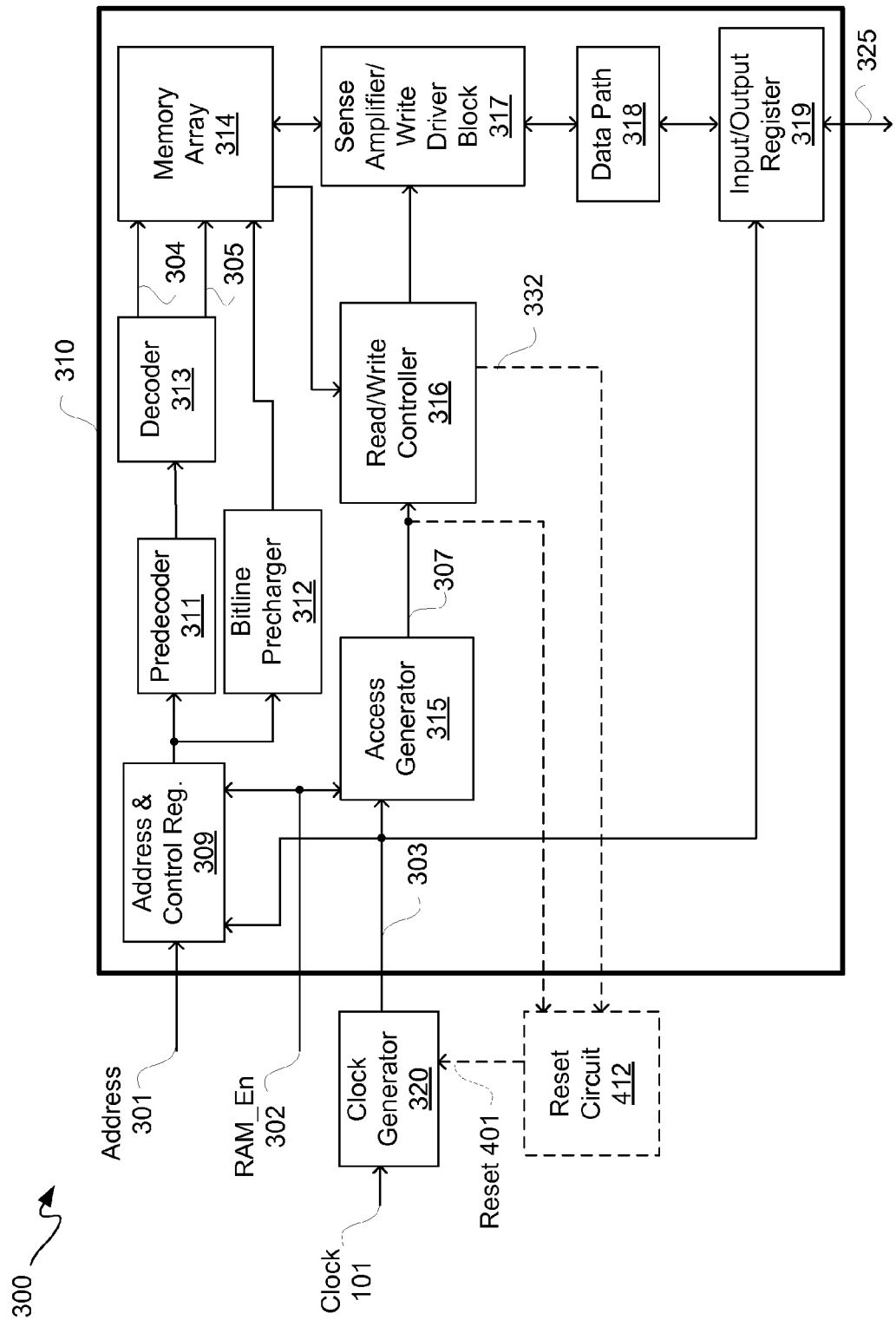
FIG. 3 is a block diagram depicting an exemplary memory system.

FIG. 3 is a block diagram depicting an exemplary memory system 300. Memory system 300 includes clock generator 320 coupled to a conventional random access memory ("RAM") 310. Memory system 300 may be embedded in a host integrated circuit device or may be part of a standalone integrated circuit device, either of which may include without limitation a stacked die having a memory device die. In this example, it is assumed that memory system 300 is for SRAM, and so RAM 310 is an SRAM 310. Optionally, memory system 300 may include a reset circuit 412 coupled to SRAM 310 and to clock generator 320.

SRAM 310 may conventionally include an address and control register ("address control register") 309, a predecoder 311, a bitline precharger 312, a decoder 313, an array of SRAM cells ("memory array" or "array of memory cells") 314, an access generator 315, a read/write controller 316, a sense amplifier/write driver block 317, a data path 318, and an input/output register 319. Along those lines, data 325 may be written to or read from SRAM 310 at an address specified by address signal 301. Coupled to a conventional SRAM 310 may be a clock generator 320 and an optional reset circuit 412.

Clock generator 320 receives an input clock signal 101 to generate output clock signal 303. Address signal 301 may be provided to address control register 309, along with a RAM enable signal 302 and output clock signal 303. Likewise, access generator 315, for generation of read and write access initiated signals 307, receives output clock signal 303 and RAM enable signal 302.

SRAM 310 generally has two operational states, namely an access operational state and a precharge operational state. An access operational state is for a read or a write access of SRAM 310, and a precharge operational state is to ready SRAM 310 for a next read or write access. SRAM 310 in this example is operated as a falling-edge dependent control system. Along those lines, a rising edge of clock signal 303 is used to enter an access operational state, which may include exiting a previous precharge operational state, and a falling edge of output clock signal 303 is used to enter a precharge operational state, which may include exiting a previous access operational state. Thus, in effect, a falling edge of output clock signal 303 is used to reset SRAM 310 for a next read or write access. In other implementation, a rising-edge and falling-edge triggering may be reversed using negative or inverted pulses.

Generally, during an access operational state for a read access, an address in memory array 314 to be read from is provided to address and control register 309, and RAM enable signal 302, along with a rising edge of a pulse of output clock signal 303, is asserted. An address output from address control register 309 is provided to predecoder 311 and bitline precharger 312. A predecoded address output from predecoder 311 is provided to decoder 313, and decoder 313 decodes such predecoded address output to assert a wordline signal 304, associated with a decoded address to a wordline, provided to memory array 314. Additionally, decoder 313 may output a reference wordline signal 305 to memory array 314 in association with a decoded address output from decoder 313 for tracking purposes.

Along those lines, memory array 314 may output a reference bitline signal to read/write controller 316 corresponding to assertion of such reference wordline signal 305. Access generator 315 may generate a read/write access initiated signal 307 provided to read/write controller 316. Read/write controller 316 may generate a sense amp enable signal provided to sense amplifier/write driver block 317 for a read access. Accordingly, assertion of a sense amp enable may be self-timed or tracked responsive to assertion of reference wordline signal 305. In other words, this timing ensures that bitlines have enough differentiation to be ready to be read.

Memory array 314 effectively conveys charge on bitlines and complement bitlines to sense amplifier/write driver block 317 to read data for output. Such data read by sense amplifier/write driver block 317 may be provided to data path 318, and data path 318 may provide such read data to input/output register 319 to output read data 325, and input/output register 319 may be clocked with clock signal 303.

After the read access is completed, responsive to a falling edge of clock signal 303 as conveyed through address control register 309, bitline precharger 312 asserts a bitline precharge signal to memory array 314 to reset or precharge bitlines in memory array 314. Access generator 315, responsive to a falling edge of clock signal 303 as well, de-asserts an access signal to read/write controller 316 to cause read/write controller 316 to de-assert a sense amp enable signal to sense amplifier/write driver block 317. This de-assertion effectively electrically shuts off a path between memory array 314 and sense amplifier/write driver block 317, which allows memory array 314 to be reset for a next access, whether a read or a write access.

As writing to SRAM 310 is known, as well as other known details regarding reading of SRAM 310, further description of SRAM 310 is avoided for purposes of clarity and not limitation.

However, in contrast to a conventional memory system, memory system 300 includes a clock generator 320 coupled to receive an input clock signal 101 to provide an output clock signal 303, which output clock signal 303 is used to clock SRAM 310 as previously described. As previously described, an address control register 309 is coupled to receive an address signal 301 and output clock signal 303, and an access generator 315 is coupled to receive output clock signal 303. Optionally, a reset circuit 412 may be coupled to receive a read/write access initiated signal 307 from access generator 315 and an access done signal 332 from read/write controller 316 for generation of a reset signal 401. This reset signal 401 may be used by clock generator 320 for feedback tracking purposes with respect to read/write timing for a falling-edge dependent waveform mode of operation. Reset circuit 412 may be a known reset circuit, as described below in additional detail, but for a new use thereof with respect to SRAM 310 and clock generator 320.

Figure 4:
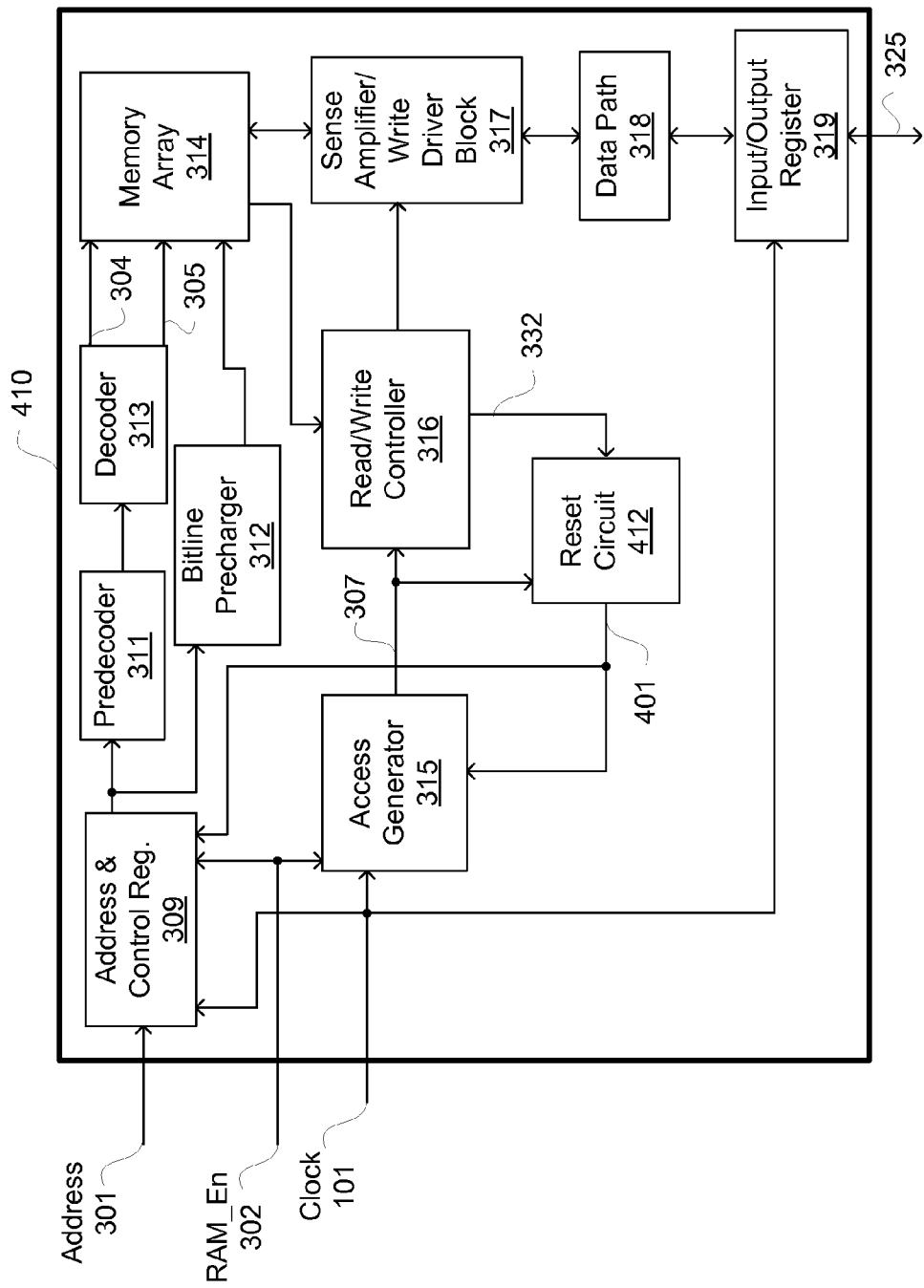
FIG. 4 is a block diagram depicting an exemplary conventional random access memory for self-timed operation.

FIG. 4 is a block diagram depicting an exemplary conventional RAM 410. RAM 410 may be embedded in a host integrated circuit device or may be part of a standalone integrated circuit device, either of which may include without limitation a stacked die having a memory device die. In this example, it is assumed that RAM 410 is for SRAM, and so RAM 410 is an SRAM 410. SRAM 410 is similar to SRAM 310, except there is no clock generator 320, and so registers 309 and 319 may be clocked with input clock signal 101. For purposes of clarity and not limitation, generally only the differences between the two SRAMs 310 and 410 are described below. However, SRAM 410 may be used in a self-timed dependent waveform mode of operation in contrast to a falling-edge dependent waveform mode of operation for SRAM 310. SRAM 410 is described in order to more clearly understand how a conventional self-timed mode of operation was implemented.

Address signal 301 may be provided to address control register 309, along with a RAM enable signal 302 and input clock signal 101. Likewise, access generator 315, for generation of read and write access initiated signals 307, receives input clock signal 101 and RAM enable signal 302. Signal timing in this example is for a self-timed dependent waveform for a memory device. In a self-timed dependent waveform mode of operation, reset signal 401 may be used by access generator 315.

In contrast to operation of SRAM 310 of FIG. 3, SRAM 410 of FIG. 4 uses a self-timed path to reset address control register 309 and address generator 315. Along those lines, SRAM 410 may use a reset circuit 412 and thus may use a reset signal 401 to control a bitline precharger 312 for a self-timed mode of operation, as described below in additional detail. Reset circuit 412 is coupled to access generator 315 to receive an access initiated signal 307 therefrom, which access initiated signal 307 is also provided to read/write controller 316 as previously described. A reference bitline signal may be provided from memory array 314 to read/write controller 316. Read/write controller 316 may assert an access done signal 332 to reset circuit 412. Such reference bitline signal and access done signal 332, along with associated circuitry, may form a self-timed path to reset circuit 412.

Reset circuit 412 may assert a reset signal 401 to access generator 315 and address control register 309. Assertion of reset signal 401 may be in response to assertion of an access done signal 332 received by reset circuit 412 from read/write controller 316. Assertion of reset signal 401 may thus cause address control register 309 and access generator 315 to be reset to cause precharging of memory array 314 and electrical decoupling of sense amplifier/write driver block 317 from memory array 314 to prepare for a next access of SRAM 410. Reset of address and control register 309 may cause register 309 to cause bitline precharger 312 to precharge bitlines in memory array 314 for a next access of SRAM 410, namely as a downstream response to assertion of reset signal 401.

Again, as writing to SRAM 410 is known, as well as other known details regarding reading of SRAM 410, further description of SRAM 410 is avoided for purposes of clarity and not limitation.

Figure 5:
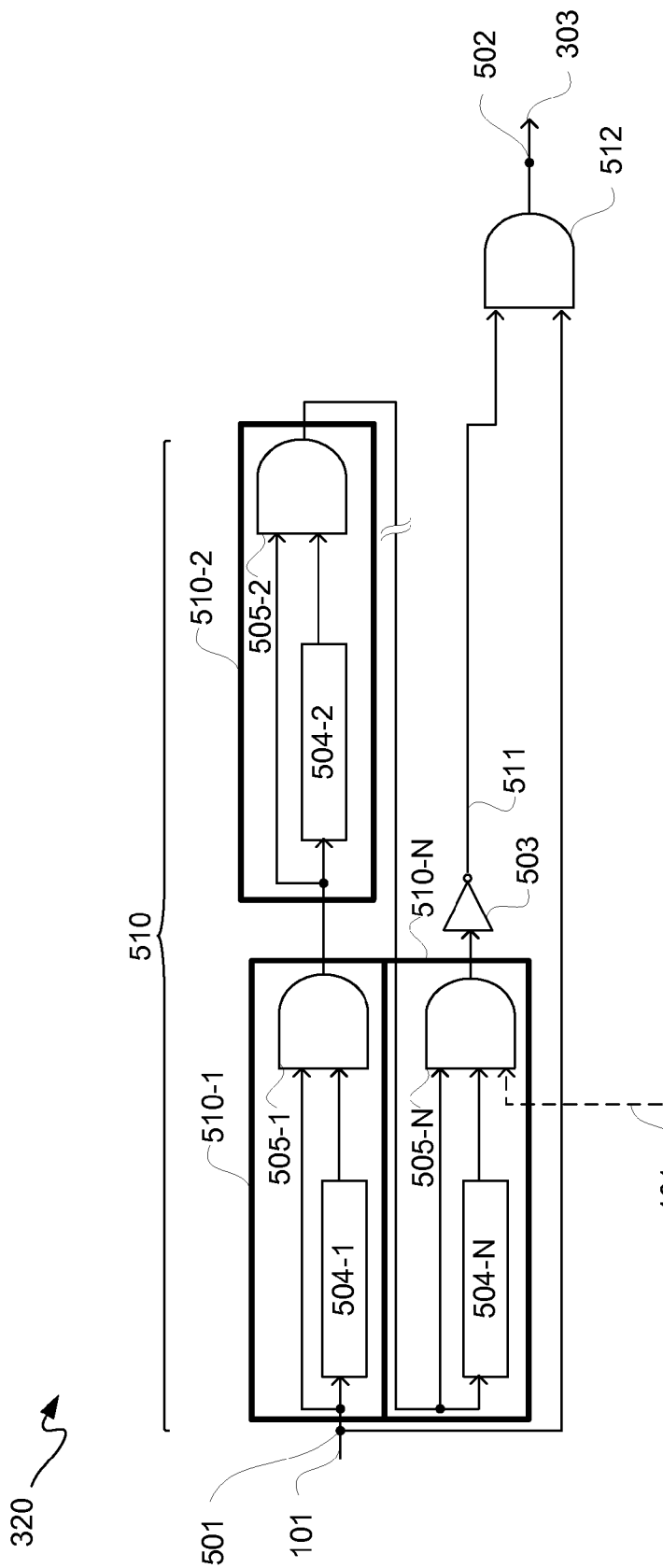
FIG. 5 is a schematic diagram depicting an exemplary clock generator.

FIG. 5 is a schematic diagram depicting an exemplary clock generator 320. Clock generator 320 includes an input node 501 to receive input clock signal 101 and an output node 502 from which output clock signal 303 may be sourced.

Clock generator 320 includes at least one pulse generator or pulse shaper 510-N coupled to input node 501. Thus, there may be a chain 510 of N pulse generators/shapers 510-N, where such chain 510 includes inverter 503.

Such at least one pulse generator 510-N is coupled to receive input clock signal 101 to provide a clock control signal 511 to a control gate. In this example, such a control gate is an AND gate 512; however, in another implementation another known type of logic gate may be used as will be understood by one of ordinary skill in the art from the description herein.

In this example, N is equal to three for three pulse generators 510-1 through 510-N coupled in series or in a chain. However, in other implementations fewer or more than three pulse generators 510 may be coupled in a series or chain.

Pulse generator 510-1 is coupled at input node 501 to receive input clock signal 101. In this example, each of pulse generators 510-1 through 510-N respectively includes delay chains, such as a series or chain of delay buffers, namely buffer chains 504-1 through 504-N. Such buffer chains 504-1 through 504-N may respectively be formed of buffers, inverters, or other logic elements used for delay. In this example, each of pulse generators 510-1 through 510-N respectively includes a logic gate, namely AND gates 505-1 through 505-N. Even though AND gates are illustratively depicted, other types of logic gates may be used consistent with the description herein.

Input clock signal 101 is provided to input node 501 for an input end of buffer chain 504-1 and an input of AND gate 505-1 both of pulse generator 510-1. An output end of buffer chain 504-1 provides another input to AND gate 505-1. An output of AND gate 505-1 is provided to an input node of pulse generator 510-2 for an input end of buffer chain 504-2 and an input of AND gate 505-2 both of pulse generator 510-2. An output end of buffer chain 504-2 provides another input to AND gate 505-2.

An output of AND gate 505-2 is provided to an input node of pulse generator 510-N for an input end of buffer chain 504-N and an input of AND gate 505-N both of pulse generator 510-N. An output end of buffer chain 504-N provides another input to AND gate 505-N. Optionally, another input to AND gate 505-N may be reset signal 401, as previously described for more closely tracking delay through feedback control for a falling-edge dependent waveform mode of operation. Thus, reset signal 401 may be input to a logic gate of a last pulse generator in a chain of pulse generators to provide feedback delay information to more closely tailor margin to actual delay, namely to reduce pulse width.

Output of AND gate 505-N may be provided as an input to inverter 503. In another configuration AND gate 505-N, namely a logic gate of a last pulse generator in a chain of pulse generators, may be replaced with a NAND gate 505-N and inverter 503 may be omitted.

Output of inverter 503 may be a clock control signal 511, which is input to a control gate, which in this example is an AND gate 512. In another implementation, a logic gate other than an AND gate may be used. Another input to AND gate 512 is input clock signal 101. Thus, generally, there may be at least one pulse generator coupled to provide clock control signal 511 to a control gate, which in this example is AND gate 512. In a high-frequency mode, clock control signal 511 is in a non-toggling state, namely such as a steady-state or DC logic 1. Therefore, AND gate 512 passes input clock signal 101 as output clock signal 303, which may be sourced from an output node 502 of clock generator 320, namely an output of AND gate 512 in this example. In a low-frequency mode, clock control signal 511 is in a toggling state, namely toggles between a logic 1 and a logic 0.

Clock generator 320 is configured to pass input clock signal 101 as output clock signal 303 in a high-frequency mode, where input clock signal 101 is gated with a non-toggling clock control signal 511. Clock generator 320 is further configured to provide a fixed pulse-width signal as output clock signal 303 in a low-frequency mode, where input clock signal 101 is gated with a toggling clock control signal 511.

Along those lines, each of pulse generators 510-1 through 510-N includes a fast propagation path directly from an input node to an input of an AND gate 505-1 through 505-N, respectively, and a slow propagation path through corresponding buffer chains 504-1 through 504-N. For a falling edge of input clock signal 101, such falling edge may thus propagate though all the logic gates of such chain pulse generators, which at a sufficiently high frequency results in a logic 0 being output from a last AND gate 505-N. This logic 0 is inverted by inverter 503 for input of a logic 1 to AND gate 512 in a high-frequency mode, and in such mode, a constant logic 1 for clock control signal 511 means that input clock signal 101 propagates to output clock signal 303 without any change to clock pulse width. If, however, delay through buffer chains 504-1 through 504-N is less than logic high time of a pulse of input clock signal 101, then a logic 1 of control clock signal may be transitioned to a logic 0 by the same rising edge of a pulse of input clock signal 101 that triggered such logic 1. Once such falling edge of a pulse of input clock signal 101 reaches then end of such pulse generators, then such clock control signal 511 may transition back to a logic 1 state.

Semiconductor process variations, within a same fabrication facility ("fab") or as between fabrication facilities ("fabs") or a combination thereof, may make having a self-timed SRAM problematic, as too much margin may be used leading to a significant reduction in performance. Additionally, users may use a product anywhere from a low to high frequency mode of operation, which may cause significant differences in power consumption, as previously described. However, as described herein, clock generator 320 may control SRAM 310 by use of output clock signal 303 to behave as a frequency dependent circuit at high frequency and, at the same time having the capability to switch, to behave as a self-timed control circuit when running such SRAM 310 at low frequency. In other words, operation of SRAM 310 may be switched between falling-edge and self-timed modes of operation responsive to frequency of input clock signal 101 as well as on a delay associated with clock generator 320.

Figure 6:
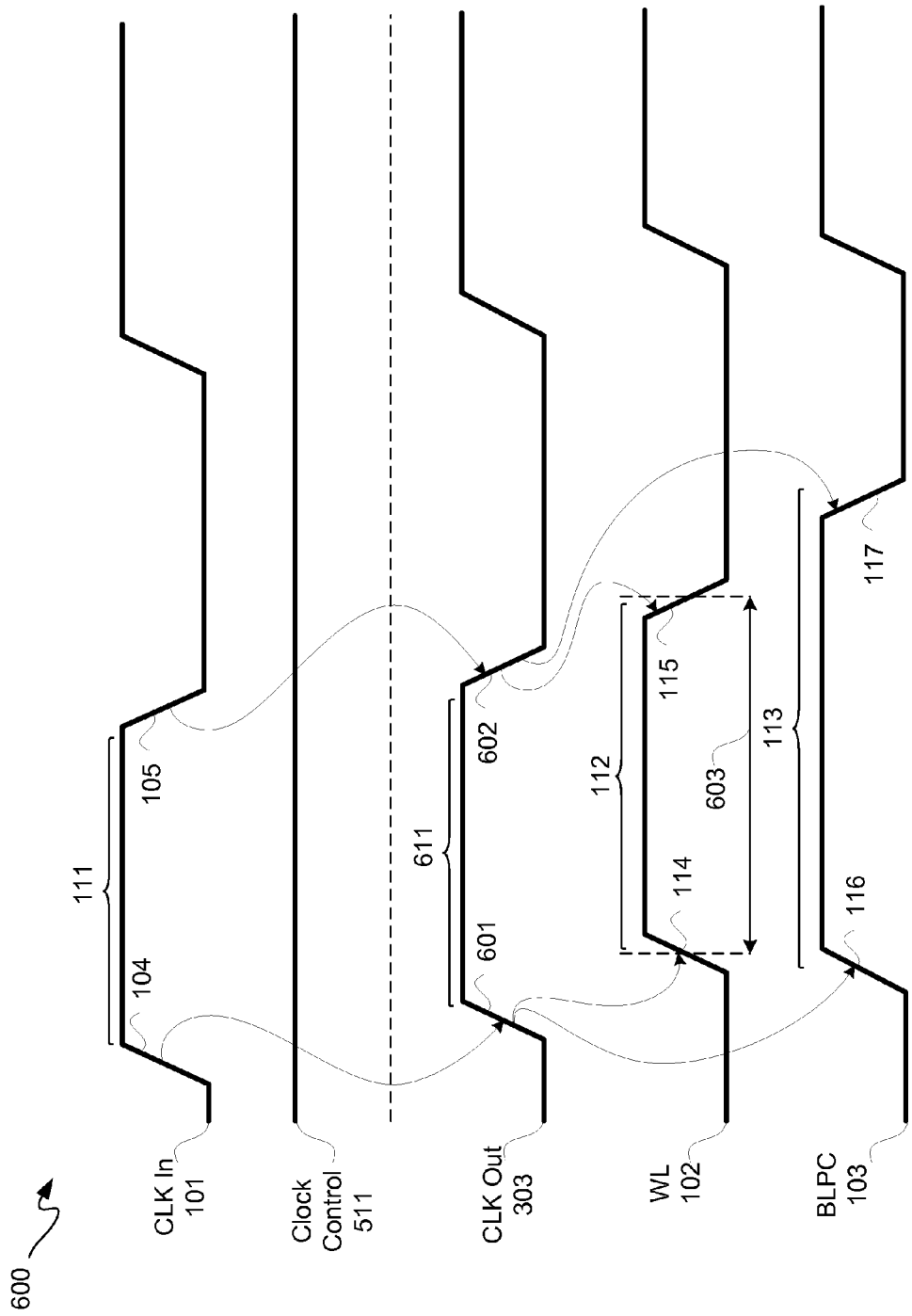
FIG. 6 is a signal diagram depicting an exemplary signal timing for operation of a Static Random Access Memory ("SRAM") in a high frequency mode.

FIG. 6 is a signal diagram depicting an exemplary signal timing 600 for operation of an SRAM 310 in a high frequency mode. In a high frequency mode, clock control signal 511 does not toggle, and in this example, stays at a logic high state. In this example, rising edge 104 of input clock signal 101 corresponds to rising edge 601 of output clock signal 303. Likewise, falling edge 105 of input clock signal 101 corresponds to falling edge 602 of output clock signal 303. In short, pulses 111 of input clock signal 101 correspond to pulses 611 of output clock signal 303, as these signals are basically the same signal with output clock signal 303 delayed with respect to input clock signal 101 due to propagation through a control gate, such as AND gate 512 for example.

Clock signal 303 is used to clock SRAM 310, where rising edges 114 and 116 correspond to rising edge 601, and where falling edges 115 and 117 correspond to falling edge 602. Wordline signal 102 pulses 112, as well as bitline precharge signal 103 pulses 113, scale in pulse width of pulses 611 basically until frequency of input clock signal 101 is sufficiently low to cause control clock signal 511 to toggle. This means that for a range of frequencies in a high-frequency mode of operation, pulse width 603 of wordline signal 102 pulses 112 is variable, namely varies with pulse width of pulses 611.

Therefore, generally for a high-frequency mode of operation, a clock generator may provide a falling edge of a clock signal dependent wordline shut-off for operation of an SRAM. In other words, at a sufficiently high frequency, a wordline shut-off for operation of an SRAM may be indexed to a falling edge of a clock signal used to clock such SRAM. This may be used advantageously to avoid having to be speed limited to a worst case PVT corner.

Figure 7:
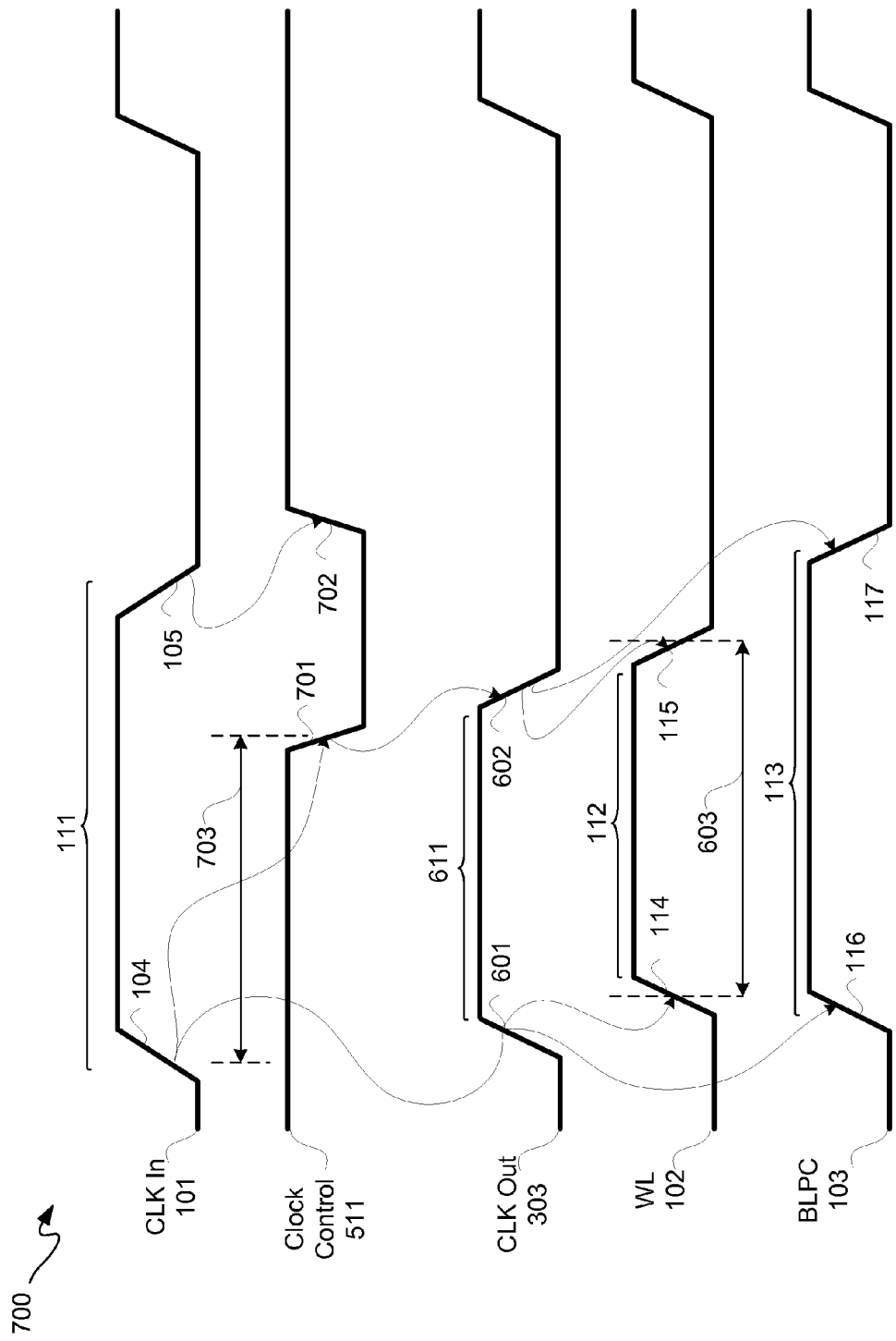
FIG. 7 is a signal diagram depicting an exemplary signal timing for operation of an SRAM in a low frequency mode.

FIG. 7 is a signal diagram depicting an exemplary signal timing 700 for operation of an SRAM 310 in a low frequency mode. In a low frequency mode, clock control signal 511 does toggle responsive to a time delay 703 from a rising edge 104 of input clock signal 101. Time delay 703 represents propagation delay of input clock signal 101 through a chain of pulse generators of clock generator 320, having at least one pulse generator. In other words, time delay 703 is less than the time or duration of logic high time or pulse width of a pulse 111 of input clock signal 101. In other words, for a clock frequency of input clock signal 101 sufficiently low such that time delay 703 is less that pulse width of pulses 111 of input clock signal 101, clock control signal 511 toggles. Generally, this means that wordline signal 102 pulses 112 may be self-timed and may have a fixed pulse width responsive to a logic high time, in this example, of pulses 111 being greater than time delay 703.

In this example, rising edge 104 of input clock signal 101 corresponds to rising edge 601 of output clock signal 303. However, falling edge 105 of input clock signal 101 corresponds to rising edge 702 of clock control signal 511. Falling edge 701 of clock control signal 511 corresponds to falling edge 602 of output clock signal 303. In other words, pulse width or logic high duration of pulses 611 of output clock signal 303 is clamped to time delay 703. Thus, even though frequency of input clock signal 101 and output clock signal 303 may be the same, output clock signal 303 has a different duty cycle than input clock signal 101. In this example, logic high duration time is shorter than logic low duration time for pulses of output clock signal 303; however, negative pulses may be used in other examples.

As clock signal 303 is used to clock SRAM 310, rising edges 114 and 116 correspond to rising edge 601, and falling edges 115 and 117 correspond to falling edge 602. Wordline signal 102 pulses 112, as well as bitline precharge signal 103 pulses 113, are fixed in pulse width to that of pulses 611 basically until frequency of input clock signal 101 is sufficiently high to cause control clock signal 511 to no longer toggle. This means that for a range of frequencies in a low-frequency mode of operation, pulse width 603 of wordline signal 102 pulses 112 is fixed, namely is fixed to a time delay 703 duration of pulse width of pulses 611. This fixed time delay may be user programmable using programmable resources to set length of buffer chains and/or number of pulse generators in a chain thereof. However, once set, this time delay 703 is fixed, which means that pulse width of wordline signal 102 pulses 112 may be self-timed to such delay, which optionally may be trimmed using a feedback of a reset signal as previously described.

Therefore, generally for a low-frequency mode of operation, a clock generator may provide a self-timed delay circuit of a clock generator dependent wordline shut-off for operation of a RAM, such as an SRAM for example. Thus, wordline pulses generated may be shorter in pulse width with respect to logic high time duration. Such shortened wordline pulse may be used to limit DC current to such shortened logic high time of such wordline pulses.

From the above description, it should be understood that falling clock edges 602 of pulses 611 of output clock signal 303 may be determined either by falling clock edges 105 of input clock signal 101 or by delayed rising edges of input clock signal 101 as propagated through a chain of pulse generators, which ever happens first with respect to reaching a control gate. Time delay 703 from rising edge 104 to falling edge 701 determines a maximum pulse width possible on output clock signal 303 for a low-frequency mode. In other words, if time delay 703 reaches width of pulse 111, then a high-frequency mode is triggered.

To recapitulate, a clock generator 320 may be configured to pass a first pulse edge of an input clock signal 101 to provide a first pulse edge of an output clock signal 303 in both a high-frequency mode and a low-frequency mode. Such a clock generator 320 may further be configured to: pass a second pulse edge of such an input clock signal 101 to provide a second pulse edge of such an output clock signal 303 in such a high-frequency mode; and pass a pulse edge of a clock control signal 511 to provide such a second pulse edge of such an output clock signal 303 in such a low-frequency mode. In the above example, such first pulse edge of each of input clock signal 101 and output clock signal 303 is a rising edge; however, a falling edge may be used in another configuration for such first pulse edges; or a falling edge and a rising edge, or vice versa, may be used in another configuration. In the above example, such a second pulse edge of each input clock signal 101 and output clock signal 303 is a falling edge; however, a rising edge may be used in another configuration for such second pulse edges; or a falling edge and a rising edge, or vice versa, may be used in another configuration. A pulse edge of clock control signal 511 is a falling edge thereof to provide such a second pulse edge of output clock signal 303 as a falling edge thereof; however, in another configuration a rising edge of clock control signal 511 may be used to provide such second pulse edge of output clock signal.

Figure 8:
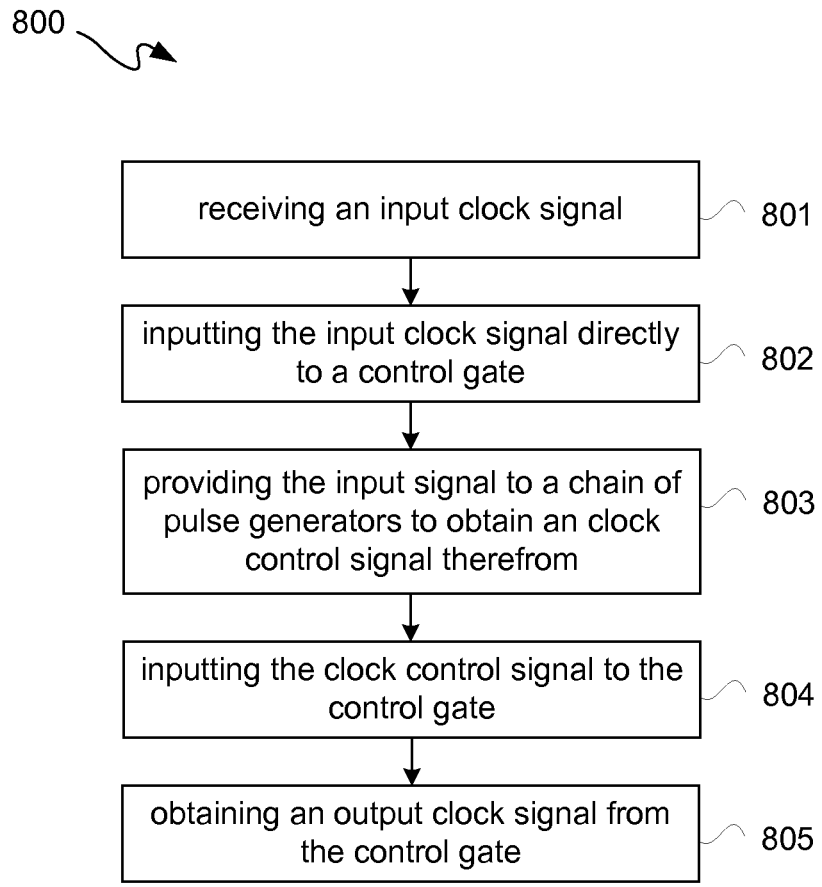
FIG. 8 is a flow diagram depicting an exemplary memory operation flow.

FIG. 8 is a flow diagram depicting an exemplary memory operation flow 800. As memory operation flow 800 recapitulates previous description, memory operation flow is generally described with simultaneous reference to FIGS. 3 through 8. At 801, an input clock signal 101 is received. At 802, input clock signal 101 may be input directly to a control gate, such as AND gate 512 for example. At 803, input signal 101 may be provided to a chain 510 of pulse generators 510-N to obtain a clock control signal 511 therefrom. At 804, clock control signal 511 may be input to such a control gate, such as AND gate 512 for example. At 805, an output signal 303 may be obtained from such a control gate, such as AND gate 512 for example. In a high-frequency mode, clock control signal 511 input to such a control gate is in a non-toggling state, and in a low-frequency mode, clock control signal 511 input to such control gate is in a toggling state. In the toggling state, a falling edge side of input clock signal 101 may be clamped with clock control signal 511 input to such a control gate to provide output clock signal 303 with a fixed pulse width. Such a fixed pulse width of output clock signal 303 may be directly proportional to propagation delay of input clock signal 303 through a chain 510 of pulse generators used to provide clock control signal 511. Such propagation delay may be less than one-half cycle of input clock signal 101. In the non-toggling state, clock control signal 511 input is a steady-state logic one. In the toggling state, such propagation delay is configured or set to cause clock control signal 101 to toggle for self-timed operation of a downstream circuit. Such downstream circuit may include an array of SRAM cells of memory array 314 coupled to sense amps of sense amplifier/write driver block 317, or other analog circuitry with a DC current path.

Because one or more of the examples described herein may be implemented, such as embedded, in an FPGA or other host integrated circuit device, a detailed description of such a host IC is provided. However, it should be understood that other types of host ICs may benefit from the technology described herein. Along those lines, even though the above description was for timing associated with an analog or hybrid analog-digital operation of a memory, it should be understood that other types of operations of devices with a DC current path other than memory may be used.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Figure 9:
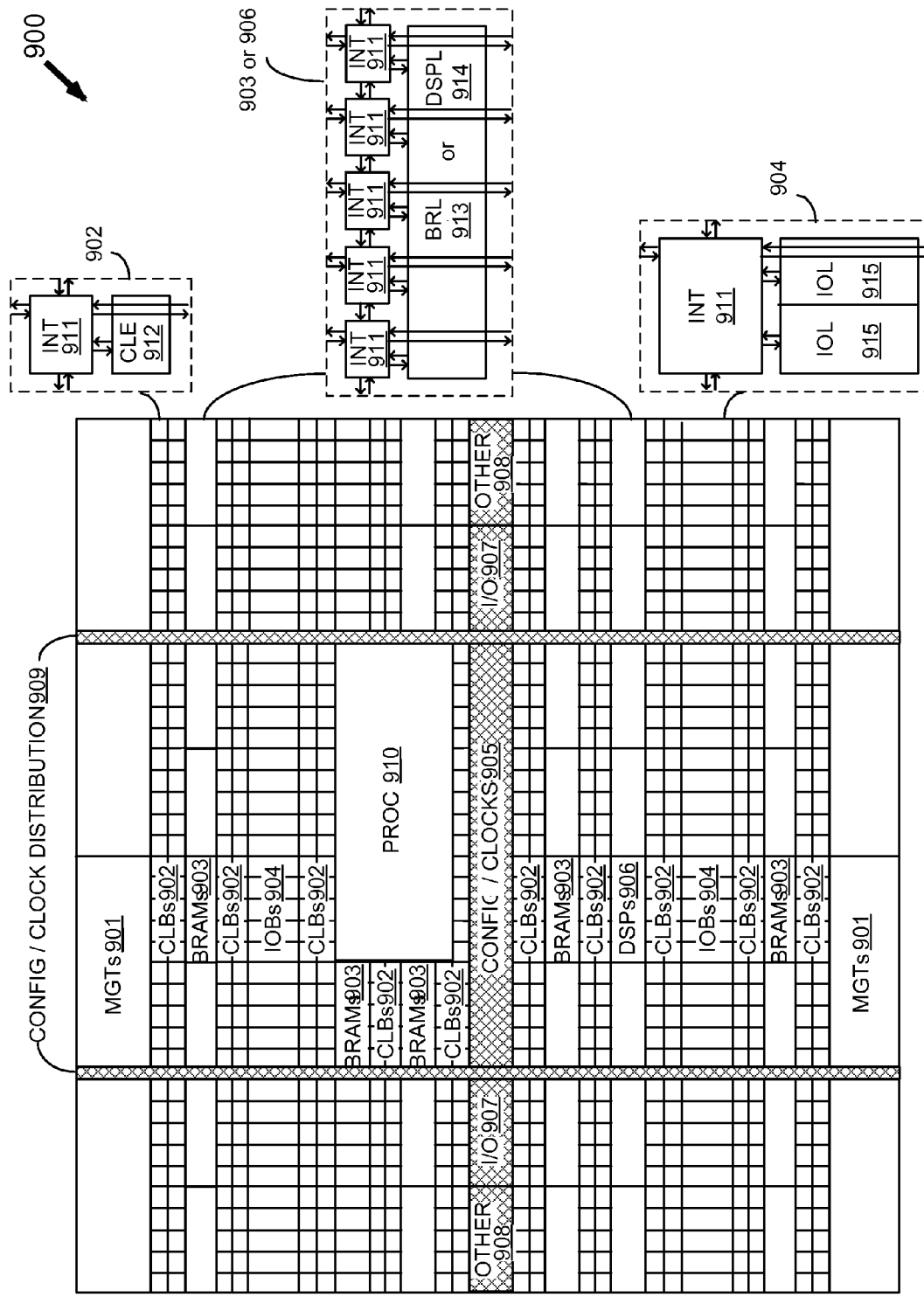
FIG. 9 is a simplified block diagram depicting an exemplary columnar Field Programmable Gate Array ("FPGA") architecture.

As noted above, advanced FPGAs can include several different types of programmable logic blocks in the array. For example, FIG. 9 illustrates an FPGA architecture 900 that includes a large number of different programmable tiles including multi-gigabit transceivers ("MGTs") 901, configurable logic blocks ("CLBs") 902, random access memory blocks ("BRAMs") 903, input/output blocks ("IOBs") 904, configuration and clocking logic ("CONFIG/CLOCKS") 905, digital signal processing blocks ("DSPs") 906, specialized input/output blocks ("I/O") 907 (e.g., configuration ports and clock ports), and other programmable logic 908 such as digital clock managers, analog-to-digital converters, system monitoring logic, and so forth. Some FPGAs also include dedicated processor blocks ("PROC") 910.

In some FPGAs, each programmable tile includes a programmable interconnect element ("INT") 911 having standardized connections to and from a corresponding interconnect element in each adjacent tile. Therefore, the programmable interconnect elements taken together implement the programmable interconnect structure for the illustrated FPGA. The programmable interconnect element 911 also includes the connections to and from the programmable logic element within the same tile, as shown by the examples included at the top of FIG. 9.

For example, a CLB 902 can include a configurable logic element ("CLE") 912 that can be programmed to implement user logic plus a single programmable interconnect element ("INT") 911. A BRAM 903 can include a BRAM logic element ("BRL") 913 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 906 can include a DSP logic element ("DSPL") 914 in addition to an appropriate number of programmable interconnect elements. An IOB 904 can include, for example, two instances of an input/output logic element ("IOL") 915 in addition to one instance of the programmable interconnect element 911. As will be clear to those of skill in the art, the actual I/O pads connected, for example, to the I/O logic element 915 typically are not confined to the area of the input/output logic element 915.

In the pictured embodiment, a horizontal area near the center of the die (shown in FIG. 9) is used for configuration, clock, and other control logic. Vertical columns 909 extending from this horizontal area or column are used to distribute the clocks and configuration signals across the breadth of the FPGA.

Some FPGAs utilizing the architecture illustrated in FIG. 9 include additional logic blocks that disrupt the regular columnar structure making up a large part of the FPGA. The additional logic blocks can be programmable blocks and/or dedicated logic. For example, processor block 910 spans several columns of CLBs and BRAMs.

Note that FIG. 9 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 9 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing describes exemplary apparatus(es) and/or method(s), other and further examples in accordance with the one or more aspects described herein may be devised without departing from the scope hereof, which is determined by the claims that follow and equivalents thereof. Claims listing steps do not imply any order of the steps. Trademarks are the property of their respective owners.

What is claimed is:

1. An apparatus, comprising:
a clock generator coupled to receive an input clock signal and further coupled to provide an output clock signal;
an address and control register coupled to receive an address signal and the output clock signal;
an access generator coupled to receive the output clock signal;
wherein the clock generator comprises:
an input node coupled to receive the input clock signal;
at least one pulse generator coupled to the input node to receive the input clock signal and further coupled to provide a clock control signal;
a control gate coupled to the input node to receive the input signal and further coupled to the at least one pulse generator to receive the clock control signal;

wherein the at least one pulse generator is coupled to provide the clock control signal to the control gate in a non-toggling state for a high-frequency mode; and
wherein the at least one pulse generator is coupled to provide the clock control signal to the control gate in a toggling state for a low-frequency mode.

2. The apparatus according to claim 1, wherein the clock generator is configured to pass the input clock signal as the output clock signal in the high-frequency mode, and to provide a fixed pulse-width signal as the output clock signal in the low-frequency mode.

3. The apparatus according to claim 1, wherein the clock generator is configured to pass:
a first pulse edge of the input clock signal to provide a first pulse edge of the output clock signal in both the high-frequency mode and the low-frequency mode;
a second pulse edge of the input clock signal to provide a second pulse edge of the output clock signal in the high-frequency mode; and
a pulse edge of the clock control signal to provide the second pulse edge of the output clock signal in the low-frequency mode.

4. The apparatus according to claim 3, wherein:
the first pulse edge of the input clock signal and the first pulse edge of the output clock signal are rising edges; and
the second pulse edge of the input clock signal and the second pulse edge of the output clock signal are falling edges.

5. The apparatus according to claim 4, wherein:
the pulse edge of the clock control signal is a falling edge of the clock control signal; and
the second pulse edge of the output clock signal is the falling edge of the output clock signal.

6. The apparatus according to claim 3, wherein the at least one pulse generator comprises:
a series of buffers coupled to the input node at an input end of the series of buffers; and
an AND gate coupled to the input node and to an output end of the series of buffers.

7. The apparatus according to claim 3, wherein the apparatus includes a memory system embedded in a host integrated circuit device.

8. A memory system, comprising:
a clock generator coupled to receive an input clock signal and further coupled to provide an output clock signal;
an address and control register coupled to receive an address signal and the output clock signal;
an access generator coupled to receive the output clock signal;
wherein the clock generator comprises:
an input node coupled to receive the input clock signal;
at least one pulse generator coupled to the input node to receive the input clock signal and further coupled to provide a clock control signal;
a control gate coupled to the input node to receive the input signal and further coupled to the at least one pulse generator to receive the clock control signal;
wherein the at least one pulse generator is coupled to provide the clock control signal to the control gate in a non-toggling state for a high-frequency mode; and
wherein the at least one pulse generator is coupled to provide the clock control signal to the control gate in a toggling state for a low-frequency mode;
a read/write control block coupled to the access generator to receive an access initiated signal therefrom and further coupled to provide an access done signal; and
a reset block coupled to the access generator to receive the access initiated signal and further coupled to the read/write control block to receive the access done signal to provide a reset signal;
wherein the clock generator is coupled to receive the reset signal as feedback to track operation.

9. The memory system according to claim 8, wherein the clock generator is configured to pass the input clock signal as the output clock signal in the high-frequency mode, and to provide a fixed pulse-width signal as the output clock signal in the low-frequency mode.

10. The memory system according to claim 8, wherein the clock generator is configured to pass:
a first pulse edge of the input clock signal to provide a first pulse edge of the output clock signal in both the high-frequency mode and the low-frequency mode;
a second pulse edge of the input clock signal to provide a second pulse edge of the output clock signal in the high-frequency mode; and
a pulse edge of the clock control signal to provide the second pulse edge of the output clock signal in the low-frequency mode.

11. The memory system according to claim 10, wherein:
the first pulse edge of the input clock signal and the first pulse edge of the output clock signal are rising edges; and
the second pulse edge of the input clock signal and the second pulse edge of the output clock signal are falling edges.

12. The memory system according to claim 11, wherein:
the at least one pulse generator is coupled to receive the reset signal as feedback to track operation;
the pulse edge of the clock control signal is a falling edge of the clock control signal; and
the second pulse edge of the output clock signal is the falling edge of the output clock signal.

13. The memory system according to claim 10, wherein the at least one pulse generator comprises:
a series of buffers coupled to the input node at an input end of the series of buffers; and
an AND gate coupled to the input node and to an output end of the series of buffers.

14. The memory system according to claim 10, wherein the memory system is embedded in a host integrated circuit device.

15. A method, comprising:
receiving an input clock signal;
inputting the input clock signal directly to a control gate;
providing the input clock signal to a chain of pulse generators to obtain a clock control signal therefrom;
inputting the clock control signal to the control gate;
obtaining an output clock signal from the control gate;
wherein in a high-frequency mode, the clock control signal input to the control gate is in a non-toggling state; and
wherein in a low-frequency mode, the clock control signal input to the control gate is in a toggling state.

16. The method according to claim 15, further comprising while in the toggling state, clamping a falling edge side of the input clock signal with the clock control signal input to the control gate to provide the output clock signal with a fixed pulse width.

17. The method according to claim 16, wherein the fixed pulse width of the output clock signal is directly proportional to a propagation delay of the input clock signal through the chain of pulse generators.

18. The method according to claim 17, wherein the propagation delay is less than one-half cycle of the input clock signal.

19. The method according to claim 16, wherein:
- in the non-toggling state, the clock control signal is a steady-state logic high; and
- in the toggling state, the propagation delay is set to cause the control clock signal to toggle for self-timed operation of a downstream circuit.

20. The method according to claim 19, wherein the downstream circuit includes an array of SRAM cells coupled to a sense amplifier/write driver circuit.

\* \* \* \* \*